United States Patent
Tatsukawa et al.

(10) Patent No.: US 11,293,094 B2
(45) Date of Patent: Apr. 5, 2022

(54) POLYCRYSTALLINE SILICON ROD MANUFACTURING METHOD, AND REACTOR

(71) Applicant: Tokuyama Corporation, Yamaguchi (JP)

(72) Inventors: Takafumi Tatsukawa, Yamaguchi (JP); Yasumasa Aimoto, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 2 days.

(21) Appl. No.: 17/043,769

(22) PCT Filed: Mar. 27, 2019

(86) PCT No.: PCT/JP2019/013209
§ 371 (c)(1),
(2) Date: Sep. 30, 2020

(87) PCT Pub. No.: WO2019/194045
PCT Pub. Date: Oct. 10, 2019

(65) Prior Publication Data
US 2021/0054499 A1  Feb. 25, 2021

(30) Foreign Application Priority Data
Apr. 5, 2018 (JP) .............................. JP2018-073258

(51) Int. Cl.
*C23C 16/24* (2006.01)
*C01B 33/035* (2006.01)
*C23C 16/455* (2006.01)

(52) U.S. Cl.
CPC ............ *C23C 16/24* (2013.01); *C01B 33/035* (2013.01); *C23C 16/45563* (2013.01)

(58) Field of Classification Search
None
See application file for complete search history.

(56) References Cited

U.S. PATENT DOCUMENTS

| 4,540,361 | A | 9/1985 | Gagne |
| 9,437,429 | B2 | 9/2016 | Kurosawa et al. |
| 2011/0274926 | A1 | 11/2011 | Oda et al. |
| 2012/0266820 | A1 | 10/2012 | Endoh et al. |

FOREIGN PATENT DOCUMENTS

| JP | H06304841 A | 11/1994 |
| JP | 2010037180 A | 2/2010 |
| JP | 2013063884 A | 4/2013 |
| WO | 2010098319 A1 | 9/2010 |

OTHER PUBLICATIONS

English Abstract for JP2010037180 A, Feb. 18, 2010.
English Abstract for JP6304841 B2, Nov. 1, 1994.
English Abstract for WO2010098319 A1, Sep. 2, 2010.
English Abstract for JP2013063884A, Apr. 11, 2013.
WIPO International Preliminary Reporton Patenteability for Application No. PCT/JP2019/013209, dated Oct. 15, 2020.

*Primary Examiner* — Joel G Horning
(74) *Attorney, Agent, or Firm* — Cahn & Samuels, LLP

(57) ABSTRACT

A method of manufacturing polycrystalline silicon rod, wherein a reactor for manufacturing a polycrystalline silicon rod includes gas supply nozzles, and at least one nozzle is a flow rate amplification nozzle having a function that the amount of a silicon deposition raw material gas supplied to the nozzle can be increased.

8 Claims, 6 Drawing Sheets

(a)

(b)

(a)

(b)

(a)

(b)

POLYCRYSTALLINE SILICON ROD MANUFACTURING METHOD, AND REACTOR

This application is a U.S. national stage application of PCT/JP2019/013209 filed on 27 Mar. 2019 and claims priority to Japanese patent document JP 2018-073258 filed on 5 Apr. 2018, the entireties of which are incorporated herein by reference.

TECHNICAL FIELD

The present invention relates to a method for manufacturing a polycrystalline silicon rod, and more particularly to, a method for manufacturing a polycrystalline silicon rod in which polycrystalline silicon is deposited onto silicon core wires standing in a reactor by a chemical vapor deposition method, and a reactor for carrying the method.

BACKGROUND OF THE INVENTION

There are conventionally known various methods for manufacturing silicon that is used as a raw material of a wafer for a semiconductor or photovoltaic power generation, and some of the methods have already been industrially carried out. For example, one of the methods is called Siemens method in which silicon core wires stand inside a reactor, and the silicon core wires are heated to a silicon deposition temperature by energization, and in this state, a silicon deposition raw material gas composed of a silane compound such as trichlorosilane ($SiHCl_3$) and monosilane ($SiH_4$) and a reducing gas is supplied into an reaction chamber to deposit silicon on the silicon core wires by a chemical vapor deposition method. This method has a characteristic that high-purity polycrystalline silicon is obtained in a form of a rod, and is carried out as the most general method.

To industrially carry out the Siemens method, typically, the reactor has a structure illustrated in FIG. 6. Specifically, a reactor 1 has such structure that the inside is hermetically sealed by a bell jar 2 and a bottom plate 3, and the bottom plate 3 is provided with a plurality of electrode pair 5 that holds silicon core wires 4 and energizes the silicon core wires 4. In addition, the reactor has a structure in which a plurality of gas supply nozzles 6 are provided in the bottom plate 3 with a tip end jetting port facing upward so as to supply a silicon deposition raw material gas to an inner space of the bell jar 2 (refer to Patent Document 1 and Patent Document 2). Note that, only one gas supply nozzle 6 is illustrated in FIG. 6, but a plurality of the gas supply nozzles 6 are provided on an upper surface of the bottom plate 3 with approximately equal intervals in an actual machine.

Here, as a type of the gas supply nozzles 6, a straight barrel pipe type in which an internal gas flow passage has the same diameter from a supply port to the tip end jetting port, a type in which a diameter of a tip end portion in the vicinity of the jetting port is slightly reduced to increase a jetting pressure of a raw material gas, and the like are generally used (refer to FIG. 4 and the like in Patent Document 1).

In addition, there is also known a type (a nozzle in which a side wall jetting port is formed) in which a jetting port of the raw material gas is also provided in a peripheral wall surface of the nozzle in the straight barrel pipe type nozzle in addition to the tip end jetting port for the purpose of forming a hooking concave portion in the vicinity of a lower end of the polycrystalline silicon rod to be manufactured. The hooking concave portion holds a hanging tool that is used to convey a rod. That is, there is known a technology in which a gas is ejected also in a lateral direction parallel to an upper surface of the bottom plate by forming the side wall jetting port, and thus the hooking concave portion for the hanging tool is formed in the vicinity of the lower end of the polycrystalline silicon rod (refer to FIG. 6 in Patent Document 2).

CITATION LIST

Patent Document

Patent Document 1: JP 2013-63884 A
Patent Document 2: WO 2010/098319 A1

In the conventional reactor, the silicon deposition raw material gas is discharged from the tip end jetting port of the gas supply nozzle to an upward space at a certain jetting pressure, but there is a constant distance up to an upper wall of the bell jar, and thus it is unavoidable that a flow rate until reaching the upper wall is considerably decreased. As a result, even when a raw material gas flow reaches an upper wall surface and reverses, a downward flow force is insufficient, and thus a raw material gas concentration is likely to be non-uniform between an upper section and a lower section inside the bell jar. Therefore, utilization efficiency of the raw material gas becomes inferior, and an intensity of power and an intensity of a raw material silane compound required for manufacturing deteriorate. In addition, in the obtained polycrystalline silicon rod, unevenness (popcorn) occurs in a surface, the diameter of the rod becomes non-uniform, and thus a shape defect occurs. In addition, when unevenness occurs in the rod surface as described above, a surface area increases, and this causes contamination by impurities.

To suppress the problems, it is required to enhance circulation of the raw material gas in the upper section and the lower section inside the bell jar by increasing a jetting rate of the silicon deposition raw material gas from the tip end jetting port of the gas supply nozzle as much as possible to raise a gas flow rate. However, when using the straight barrel type gas supply nozzle as mentioned above, there is a limitation to the improvement, and thus a satisfactory effect is not obtained.

In addition, the problems cannot be sufficiently solved even when using a nozzle in which the side wall jetting port is formed in addition to the tip end jetting port as the gas supply nozzle. More specifically, the side wall jetting port jets the raw material gas in a horizontal direction, and thus circulating effect of the atmosphere at the lower section in the bell jar is enhanced to a certain extent. However, as the raw material gas is jetted from the side wall jetting port, the jetting rate from the jetting port in the tip end of the nozzle is reduced, the force of the jetting is weakened, and circulation of the atmosphere between the upper section and the lower section inside the bell jar deteriorates From these, in manufacturing of the polycrystalline silicon rod by the Siemens method, a major problem is to develop a method of carrying out the manufacturing while circulation of the raw material gas is excellent in the upper section and the lower section inside the bell jar by further improving a jetting rate of the silicon deposition raw material gas from the gas supply nozzles, and by strengthening the force of a gas flow through the improvement.

SUMMARY OF THE INVENTION

The present inventors have made a thorough investigation in consideration of such problems. As a result, they found that when using a flow rate amplification nozzle having such function to increasing a flow rate of a silicon deposition raw material gas supplied to the nozzle and jetting the gas as a gas supply nozzle, the above-described problem can be solved, and they accomplished the invention.

Specifically, according to an aspect of the invention, there is provided a method for manufacturing a polycrystalline silicon rod. The method uses a reactor having a structure in which the inside is hermetically sealed by a bell jar and a bottom plate, the bottom plate is provided with a plurality of electrode pair that holds silicon core wires and energizes the silicon core wires, and a plurality of gas supply nozzles for supplying a silicon deposition raw material gas to an inner space of the bell jar are provided with such manner that each tip end jetting port faces upward.

The silicon deposition raw material gas is jetted from the gas supply nozzles while energizing the silicon core wires to deposit polycrystalline silicon on the silicon core wires.

At least one of the gas supply nozzles is a flow rate amplification nozzle having such function that the silicon deposition raw material gas supplied to the nozzle is mixed with an atmosphere inside the bell jar, which is introduced into the nozzle, and the mixed gas in which the amount of the silicon deposition raw material gas is increased is jetted.

In addition, according to another aspect of the invention, there is provided a reactor for manufacturing a polycrystalline silicon rod. The reactor has a structure in which the inside is hermetically sealed by a bell jar and a bottom plate, the bottom plate is provided with a plurality of electrode pair that holds silicon core wires and energizes the silicon core wires, and a plurality of gas supply nozzles for supplying a silicon deposition raw material gas to an inner space of the bell jar are provided with such manner that each tip end jetting port faces upward.

At least one of the gas supply nozzles is a flow rate amplification nozzle having such function that the silicon deposition raw material gas supplied to the nozzle is mixed with an atmosphere inside the bell jar, which is introduced into the nozzle, and the mixed gas is jetted in a state that the amount of the silicon deposition raw material gas is increased.

According to the method for manufacturing a polycrystalline silicon rod of the invention, a jetting rate of the silicon deposition raw material gas from the gas supply nozzles can be further improved, and according to this, the force of a gas flow jetted is strengthened. Accordingly, the polycrystalline silicon rod can be manufactured while circulation of the raw material gas in an upper section and a lower section inside the bell jar is excellent, and use efficiency of the raw material gas is enhanced. Accordingly, an intensity of power and an intensity of a raw material silane compound required for manufacturing of the polycrystalline silicon rod can be greatly improved.

In addition, even in the obtained polycrystalline silicon rod, unevenness is less likely to occur on a surface, and uniformity of the diameter of the rod can be improved. Accordingly, the rod surface is excellent in smoothness, and it is possible to significantly reduce impurity contamination due to an increase in surface area.

DETAILED DESCRIPTION OF THE INVENTION

An embodiment of the invention will be described below, but the invention is not limited thereto. The invention is not limited to respective configurations to be described below, and various modifications can be made. That is, an embodiment obtained by appropriately combining technical means disclosed in each of other embodiments is also included in the technical range of the invention. In addition, all of patent documents described in this specification are cited as a reference citation in this specification. In addition, in this specification, "A to B" representing a numeral value range means "equal to or greater than A (includes A and is greater than A) and equal to or less than B (includes B and is less than B)" unless otherwise stated.

Figure 6:
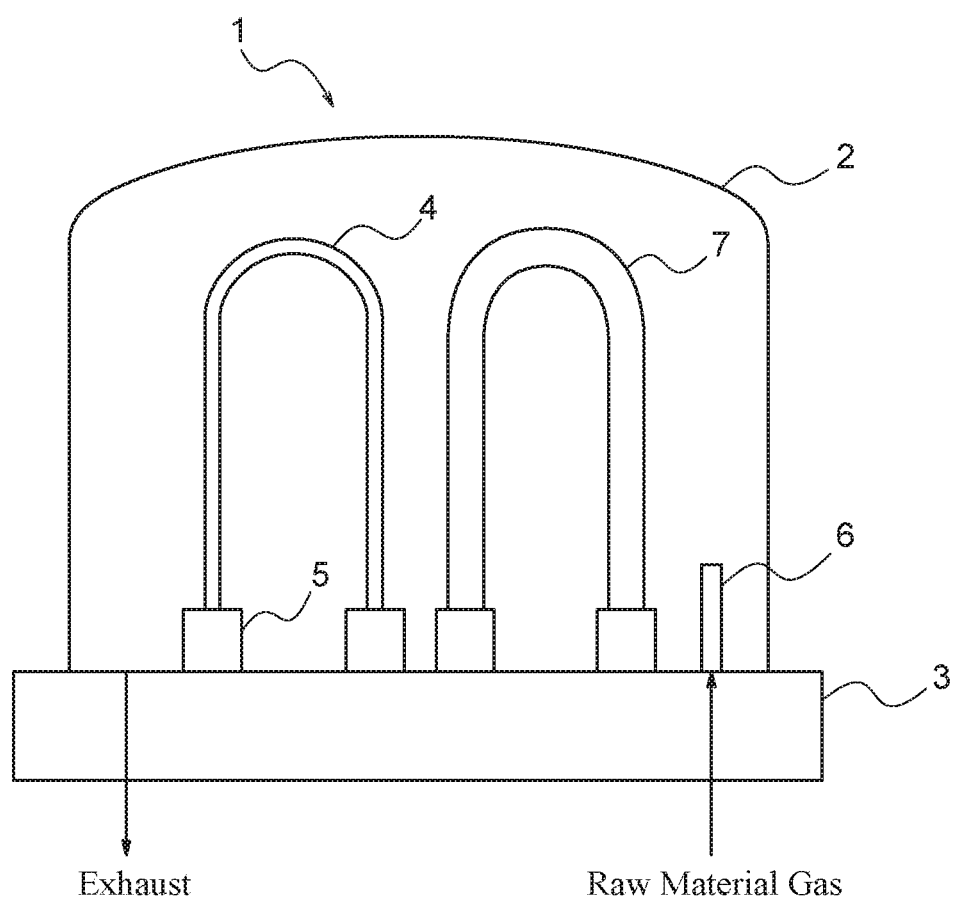
FIG. 6 is a schematic view illustrating a structure of a reactor for manufacturing a polycrystalline silicon rod as a representative aspect applied to the invention.

In the invention, manufacturing of a polycrystalline silicon rod is carried out in accordance with a so-called Siemens method in which a silicon deposition raw material gas composed of a silane compound such as trichlorosilane ($SiHCl_3$) and monosilane ($SiH_4$) and a reducing gas is brought into contact with a silicon core wire heated to a silicon deposition temperature by energization to deposit silicon on the silicon core wire by a chemical vapor deposition method. As illustrated in FIG. 6, a reactor has a structure in which the inside is hermetically sealed by a bell jar 2 and a bottom plate 3, the bottom plate 3 is provided with a plurality of electrode pair 5 that holds silicon core wires 4 and energizes the silicon core wire 4, and a plurality of gas supply nozzles 6 for supplying the silicon deposition raw material gas to an inner space of the bell jar 2 are provided with such manner that a tip end jetting port faces upward. With respect to the reactor 1 having the above-described structure, the silicon deposition raw material gas is jetted from the gas supply nozzle 6 while energizing the silicon core wire 4, and polycrystalline silicon 7 is deposited on the silicon core wire 4 to manufacture a polycrystalline silicon rod.

The greatest characteristic of the invention is that a flow rate amplification nozzle to be described later in detail is used as at least one of the gas supply nozzles 6 provided in the reactor 1. Here, the flow rate amplification nozzle is defined as a nozzle having such function to increasing the amount of silicon deposition raw material gas supplied to the nozzle through mixing with an atmosphere inside a bell jar, which is introduced into the nozzle, and jetting the mixed gas. Accordingly, when using the flow rate amplification nozzle, in manufacturing of the polycrystalline silicon rod, the silicon deposition raw material gas can be jetted from a tip end jetting port while the amount of the silicon deposition raw material gas supplied to the nozzle is increased through mixing with the atmosphere in the bell jar at the inside of the nozzle and the force of the silicon deposition raw material gas is strengthened. As a result, a fast gas flow rate of the raw material gas is maintained, and is jetted until reaching an upper section inside the bell jar, and the raw material gas can turn into a strong downward flow after reaching an upper wall surface, and thus it is possible to greatly improve circulation of the raw material gas in the upper section and the lower section inside the bell jar.

As the flow rate amplification nozzle, any nozzles are applicable as long as it has an amplification function of the raw material gas. However, typically, preferred nozzle has such structure that an opening portion is provided in a nozzle peripheral wall, and which has a function of suctioning an atmosphere at the periphery of the nozzle from the peripheral wall opening portion into a silicon deposition raw material gas flow passage when the raw material gas flows through the silicon deposition raw material gas flow passage inside the nozzle toward a tip end jetting port.

Here, whether the peripheral wall opening portion acts as "suction port" of the atmosphere at the periphery of the nozzle or as "jetting port" of a raw material gas flowing through the silicon deposition raw material gas flow passage as described in the above-described Patent Document 2 is determined depending on which of a pressure of an inner wall surface side opening portion of the peripheral wall opening portion and a pressure of an outer wall surface side opening portion thereof is larger. That is, in the above-described Patent Document 2, since a cross-sectional area of a tip end jetting port of the gas supply nozzle is smaller than an inner cross-sectional area of the silicon deposition raw material gas flow passage at an inner wall side opening lower end portion of the peripheral wall opening portion, the pressure inside the nozzle becomes larger than the atmosphere at the periphery of the nozzle, and the peripheral wall opening portion acts as a raw material gas jetting port. On the other hand, the flow rate amplification nozzle has such structure that the inner cross-sectional area of the silicon deposition raw material gas flow passage at upper end portion of an inner wall side opening of the peripheral wall opening portion is larger than an inner cross-sectional area of the passage in the vicinity of lower end portion of the inner wall side opening of the peripheral wall opening portion. Accordingly, the raw material gas flowing through the silicon deposition raw material gas flow passage is rapidly expanded, and a pressure inside the nozzle becomes lower than the atmosphere at the periphery of the nozzle, and thus the peripheral wall opening portion acts as a suction port of an atmosphere gas. That is, the flow rate amplification nozzle increases a flow rate by a Venturi effect and a Bernoulli's principle.

In addition, regarding the peripheral wall opening portion, an opening direction of penetrating the inner wall surface to the outer wall surface of the nozzle peripheral wall is important, and thus the peripheral wall opening portion is provided as a downward opening from an inner wall surface side opening toward an outer wall surface side opening. That is, in the case of an opening in which the opening direction is horizontal or upward from the inner wall surface side opening toward the outer wall surface side opening, a raw material gas flowing upward through the silicon deposition raw material gas flow passage, and a gas that flows in from the opening collide with each other, and thus a pressure loss increases and a suction function is reduced due to an influence of the pressure loss.

Figure 1:
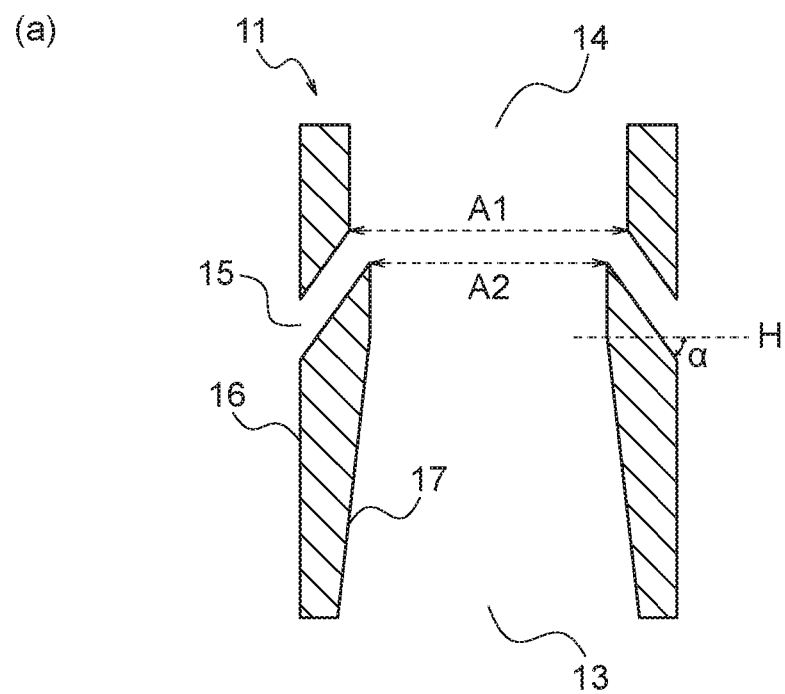
FIG. 1 is a cross-sectional view (a) and a partially notched perspective cross-sectional view (b) of a representative aspect of a flow rate amplification nozzle that is used in the invention.
Figure 1:
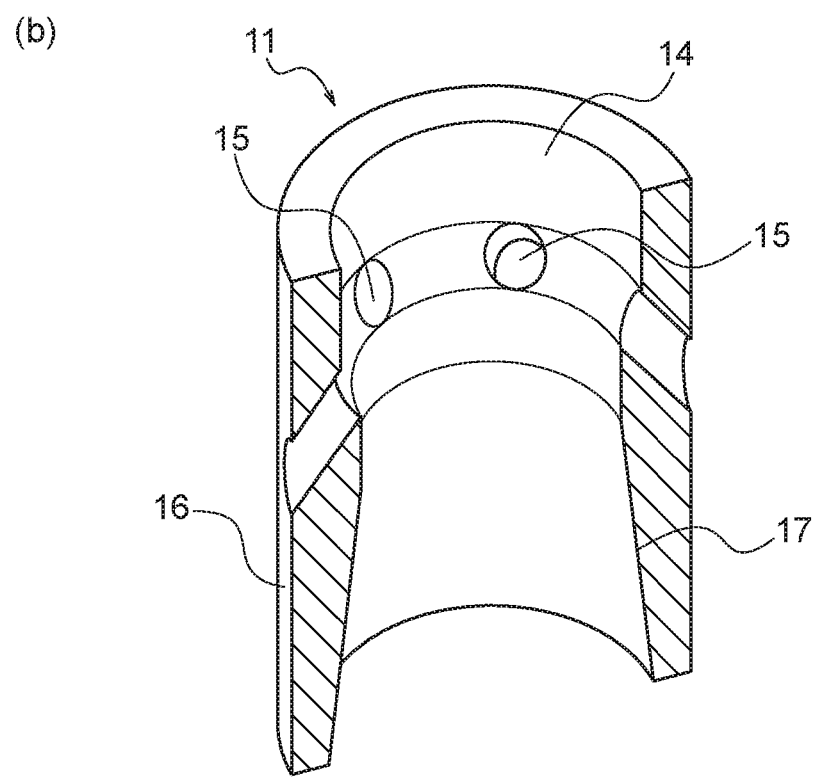

Formation conditions of the peripheral wall opening portion are adjusted in order for the peripheral opening portion to act as a suction port. FIG. 1 is a cross-sectional view of a flow rate amplification nozzle that is appropriately used in the invention. An inner space of a nozzle main body 11 acts as a silicon deposition raw material gas flow passage 12, and a reduced diameter portion 17 in which a flow path diameter is reduced continuously or step by step. Note that, the nozzle main body 11 is typically a circular tube, but may be a rectangular tube or the like. The silicon deposition raw material gas flows in from a raw material gas supply port 13 in a nozzle lower end and is jetted from a tip end jetting port 14.

In the flow rate amplification nozzle in FIG. 1, a peripheral wall opening portion 15 is provided in an aspect of being inclined downward from an inner wall surface side opening toward an outer wall surface side opening with respect to a nozzle peripheral wall 16. A silicon deposition raw material gas flow flowing through the inside of the silicon deposition raw material gas flow passage 12 is set to a constant fast speed. Accordingly, when an opening diameter of the peripheral wall opening portion 15 is not excessively large to such extent that the suction function is damaged, a bell jar atmosphere at the periphery of the nozzle is suctioned into the silicon deposition raw material gas flow passage 12. As a result, the silicon deposition raw material gas supplied to the nozzle is mixed with the atmosphere inside the bell jar, which is suctioned into the nozzle, and the mixed gas is jetted while the amount thereof is increased.

Here, in order for the peripheral wall opening portion 15 to exhibit a sufficient suction function, it is preferable that a pressure of the silicon deposition raw material gas flowing through the silicon deposition raw material gas flow passage 12 is lower than a pressure of an atmosphere gas at least at a position of the peripheral wall opening portion 15 by 0.001 to 10000 Pa, and more preferably 100 to 2000 Pa.

In the case of an aspect in which a flow path diameter of the silicon deposition raw material gas flow passage 12 is set to a straight barrel type having the same diameter as a diameter of a supply line of the raw material gas, and the flow rate is maintained to be the same as the supply rate, a pressure of the raw material gas may not reach a preferred pressure difference in the vicinity of the inner wall side opening of the peripheral wall opening portion 15. Accordingly, it is preferable to form the reduced diameter portion 17 in the silicon deposition raw material gas flow passage 12 so that a flow path diameter is reduced continuously or step by step in an entire region or a predetermined region between the raw material gas supply port 13 to the peripheral wall opening portion 15. In this case, a flow path diameter in the vicinity of an inner wall side opening lower end portion (A2) of the peripheral wall opening portion 15 can be reduced, and thus a flow rate of the silicon deposition raw material gas flowing the portion becomes fast, and thus a pressure difference in the vicinity of the inner wall side opening is easily adjusted within the preferred range. It is preferable that the reduced diameter portion 17 is provided so that the flow path diameter is reduced to 80% or less of the diameter of the raw material gas supply port 13, and more preferably 5% to 60%.

In addition, it is preferable that the silicon deposition raw material gas flow passage 12 is set to an aspect in which a diameter at an inner wall side opening upper end portion (A1) of the peripheral wall opening portion 15 is greater than the diameter of the inner wall side opening lower end portion (A2) of the peripheral wall opening portion 15. In other words, it is preferable to employ a structure in which an inner cross-sectional area of the silicon deposition raw material gas flow passage 12 at the inner wall side opening upper end portion (A1) of the peripheral wall opening portion 15 of the flow rate amplification nozzle is greater than an inner cross-sectional area at the inner wall side opening lower end portion (A2) of the peripheral wall opening portion.

In this structure, a volume of the raw material gas flowing through the silicon deposition raw material gas flow passage 12 expands in the vicinity of the inner wall side opening upper end portion (A1) due to the diameter expansion, and thus a pressure is temporarily lowered. As a result, the suction function of the nozzle peripheral atmosphere from the peripheral wall opening portion 15 is further enhanced, and thus this structure is preferable. However, when the diameter is excessively expanded at the inner wall side opening upper end portion (A1), and when the expanded flow path diameter is substantially maintained up to the tip end jetting port 14, a decrease in the flow rate of the raw material gas jetted from the nozzle occurs. From this viewpoint, it is preferable that the inner cross-sectional area at the inner wall side opening upper end portion (A1) is greater than the inner cross-sectional area at the inner wall side opening lower end portion (A2) of the peripheral wall opening portion 15 in a ratio of 1.1 to 4.0 times, more preferably 1.1 to 3.0 times, and still more preferably 1.2 to 3.0 times.

Figure 2:
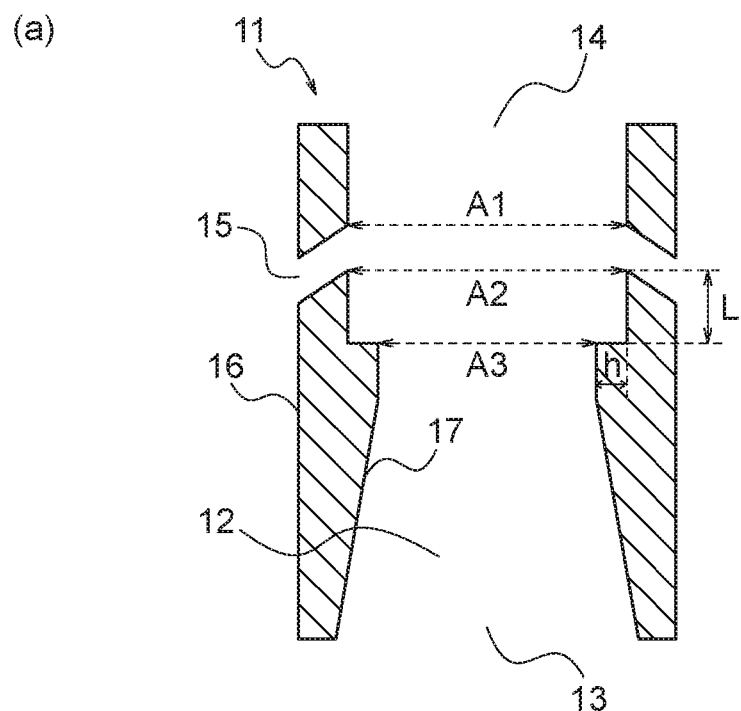
FIG. 2 is a cross-sectional view (a) and a partially notched perspective cross-sectional view (b) of another aspect of the flow rate amplification nozzle that is used in the invention.
Figure 2:
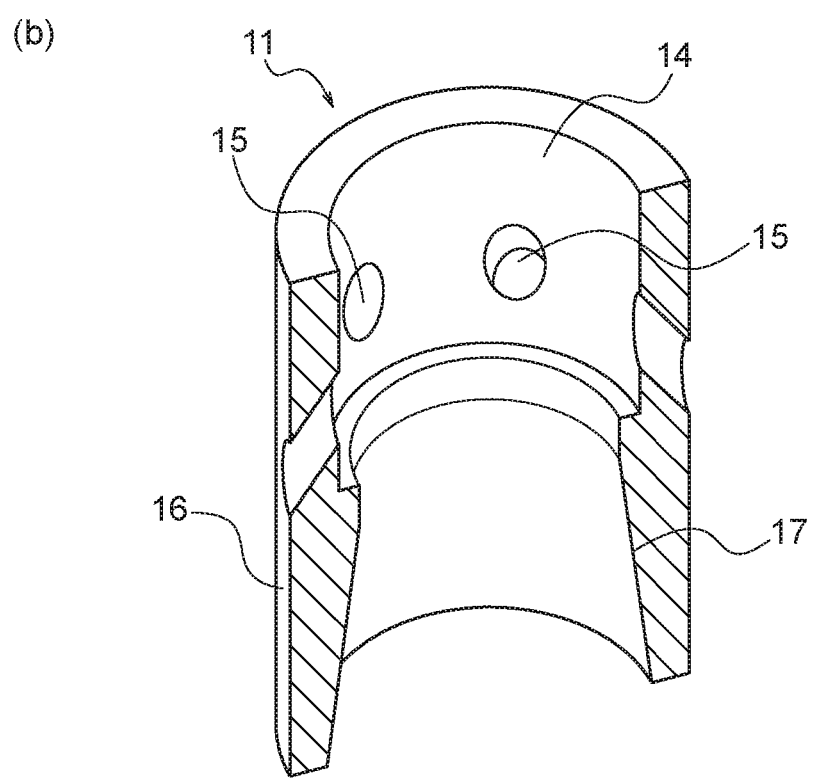

Note that, in the structure of the aspect in FIG. 1, the inner cross-sectional area of the silicon deposition raw material gas flow passage 12 at the inner wall side opening upper end portion (A1) of the peripheral wall opening portion 15 of the flow rate amplification nozzle is greater than the inner cross-sectional area at the inner wall side opening lower end portion (A2) of the peripheral wall opening portion 15, and an expanded diameter portion of the silicon deposition raw material gas flow passage 12 is provided from the lower end portion (A2) to the upper end portion (A1) of the peripheral wall opening portion. However, when a pressure reduction effect due to volume expansion of the raw material gas extends to the vicinity of the peripheral wall opening portion 15, and suction of the atmosphere gas from the peripheral wall opening portion 15 occurs, the expanded diameter portion of the silicon deposition raw material gas flow passage 12 may be provided slightly upstream side of the flow path (directed to an inner wall side opening lower end portion of the peripheral wall opening portion) in comparison to the inner wall side opening lower end portion (A2) of the peripheral wall opening portion 15. Specifically, as illustrated in FIG. 2, in the silicon deposition raw material gas flow passage 12, when an increase in the flow path diameter due to the expanded diameter is set to "h", and a length of the flow path from an expanded diameter initiation site (A3) to the inner wall side opening lower end portion (A2) of the peripheral wall opening portion is set to "L", as far as a relationship of L≤15 h, and more preferably L≤10 h is satisfied, a structure in which the diameter is expanded in the vicinity of the inner wall side opening lower end portion of the peripheral wall opening portion may be employed.

In addition, in the flow rate amplification nozzle, it is preferable that an opening direction of the peripheral wall opening portion 15 is inclined downward at an angle of 5° to 90° (illustrated by "α" in FIG. 1) from the inner wall surface side opening to the outer wall surface side opening with respect to a horizontal plane H, and more preferably 10° to 60°.

Figure 3:
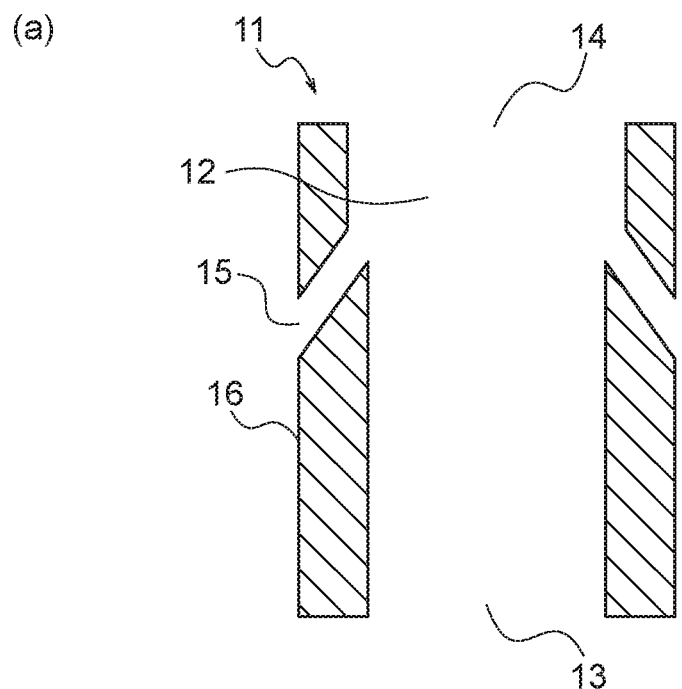
FIG. 3 is a cross-sectional view (a) and a partially notched perspective cross-sectional view (b) of still another aspect of the flow rate amplification nozzle that is used in the invention.
Figure 3:
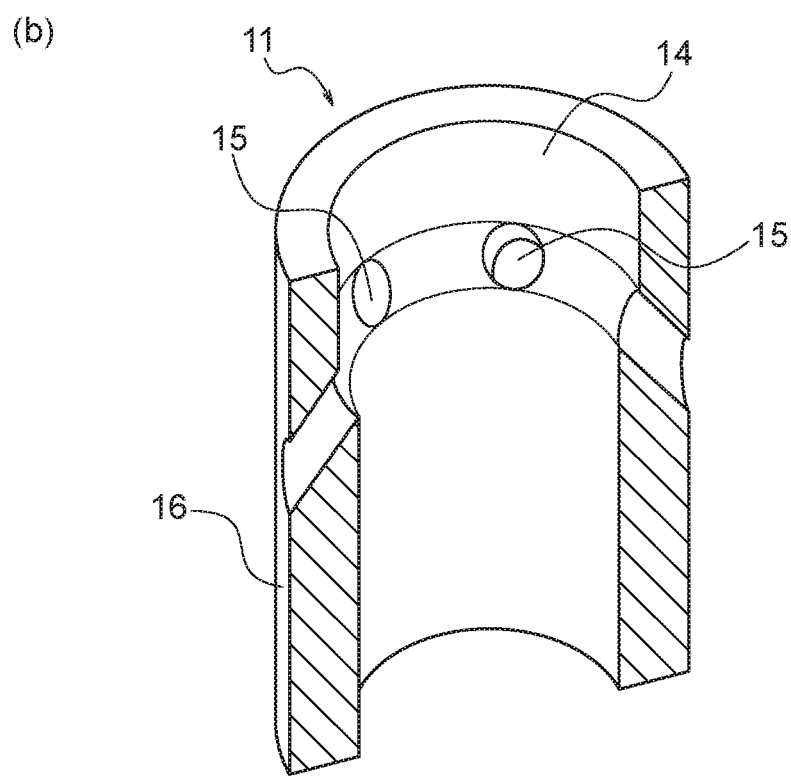
Figure 4:
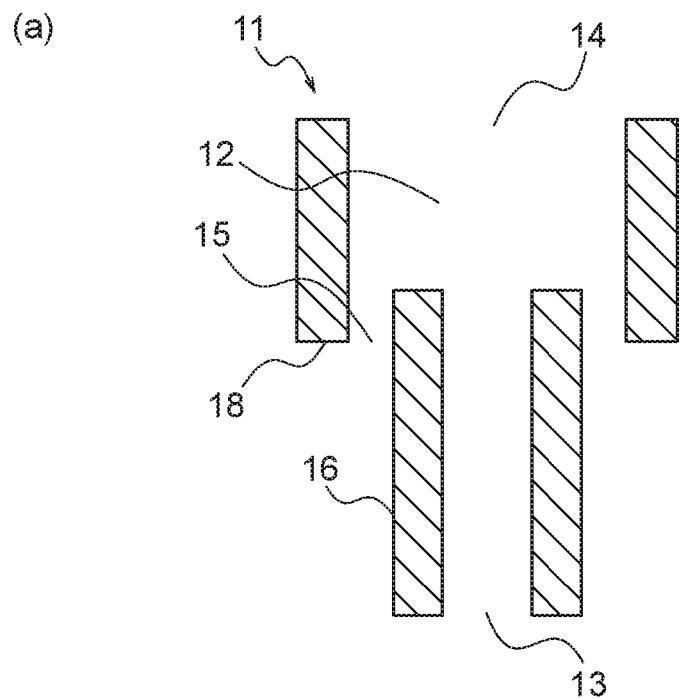
FIG. 4 is a cross-sectional view (a) and a partially notched perspective cross-sectional view (b) of still another aspect of the flow rate amplification nozzle that is used in the invention.
Figure 4:
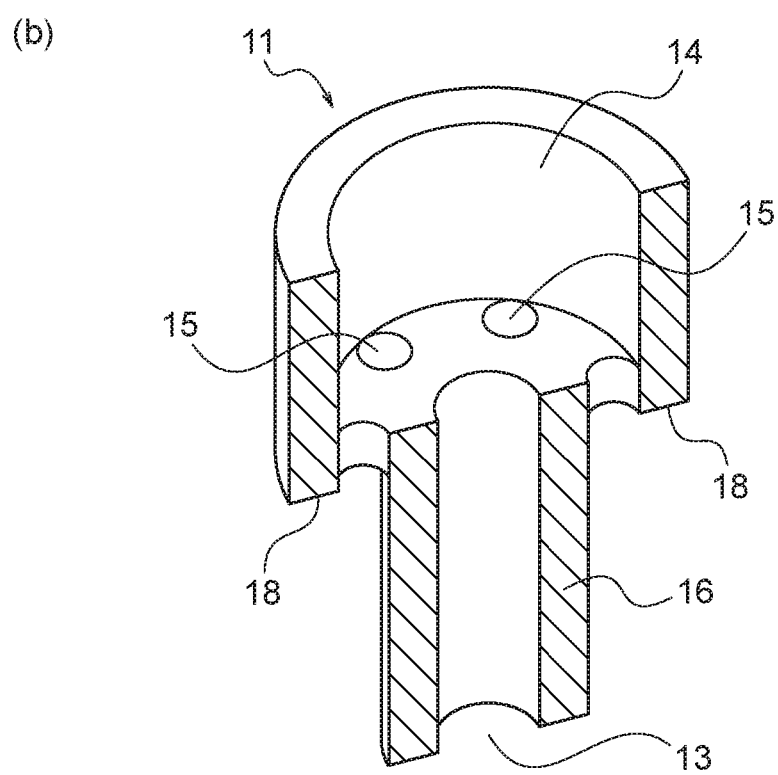
Figure 5:
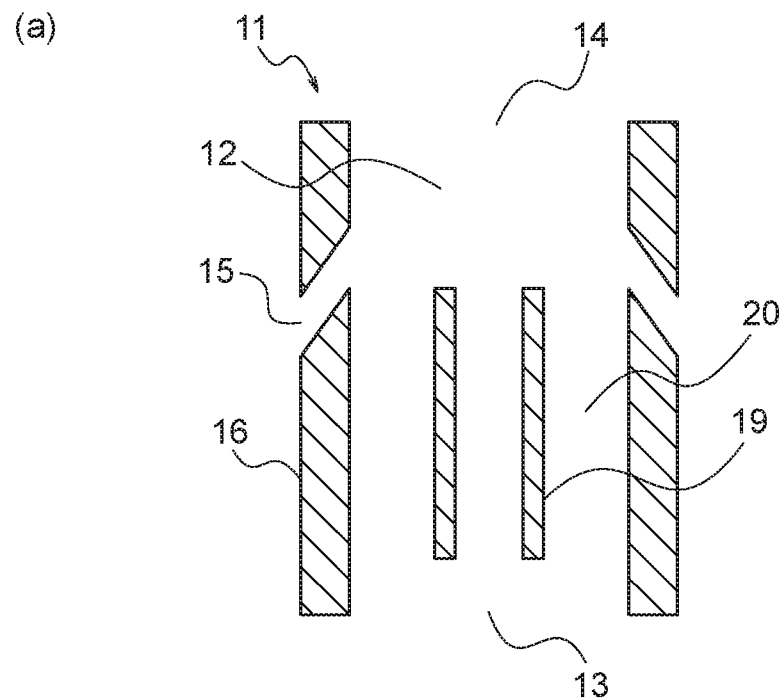
FIG. 5 is a cross-sectional view (a) and a partially notched perspective cross-sectional view (b) of still another aspect of the flow rate amplification nozzle that is used in the invention.
Figure 5:
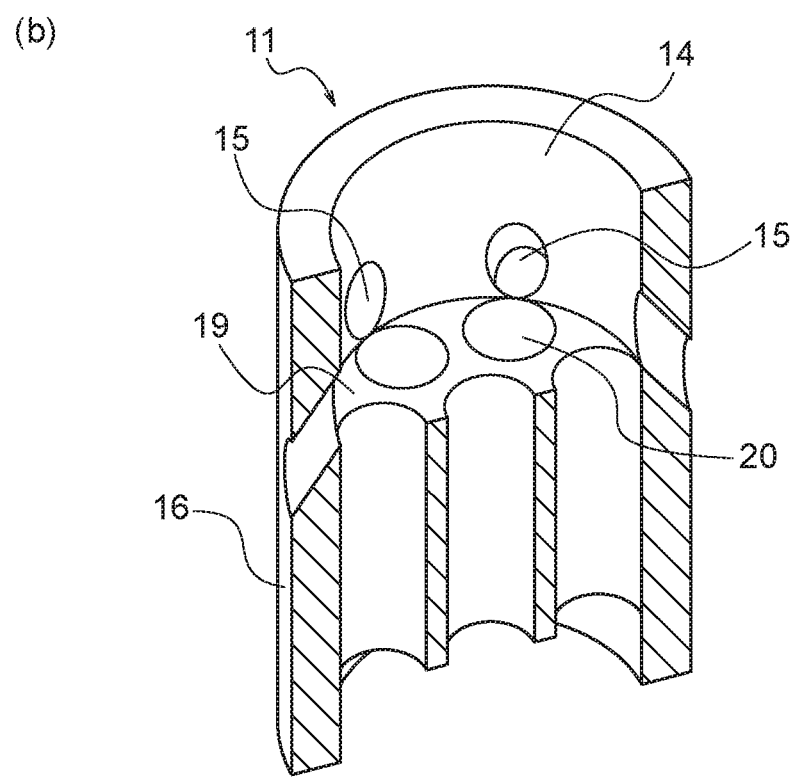

FIG. 3 to FIG. 5 illustrate other preferred aspects of the flow rate amplification nozzle that is used in the invention. FIG. 3 is a cross-sectional view in a case of the flow rate amplification nozzle in FIG. 1 is modified so that the silicon deposition raw material gas flow passage 12 is set to a direct barrel type without forming the reduced diameter portion 17 between the raw material gas supply port 13 and the peripheral wall opening portion 15.

In addition, in the flow rate amplification nozzle in FIG. 1, the peripheral wall opening portion 15 is provided in an aspect of being inclined downward from the inner wall surface side opening to the outer wall surface side opening with respect to the nozzle peripheral wall 16. Instead of this, in the flow rate amplification nozzle in FIG. 4, the peripheral wall opening portion 15 is different from the above-described aspect in that the peripheral wall opening portion 15 is formed toward a straightly downward side with respect to the nozzle peripheral wall 16. That is, a case where the angle α is 90° is illustrated. In the peripheral wall 16 of the nozzle main body 11, an overhang portion 18 of which a diameter is increases in a horizontal direction between a lower end to an upper end, and the peripheral wall opening portion 15 is formed so that the opening direction faces an immediately downward side. In this case, the inner wall side opening surface of the peripheral wall opening portion 15 becomes horizontal.

Note that, FIG. 5 illustrates still another aspect of the flow rate amplification nozzle that is used in the invention. In the aspect in FIG. 5, the flow rate amplification nozzle in FIG. 1 is modified so that, instead of providing the reduced diameter portion 17 by reducing the flow path diameter in the silicon deposition raw material gas flow passage 12 from the raw material gas supply port 13 to the peripheral wall opening portion 15, a constriction portion 19 that partially clogging the raw material gas flow passage is formed from the lower end of the peripheral wall opening portion 15 to an upstream side of the flow path. The constriction portion 19 is composed of a plurality of small openings 20 communicating with upper and lower surfaces of the constriction portion 19, and a portion other than the small openings is clogged. The sum of inner cross-sectional areas of the plurality of small openings 20 is smaller than the inner cross-sectional area of the raw material gas supply port 13. Accordingly, the same effect is obtained as in the aspect in which the diameter of the silicon deposition raw material gas flow passage 12 is reduced by narrowing the flow path diameter as in FIG. 1.

In the above-described flow rate amplification nozzle, the silicon deposition raw material gas supplied to the nozzle is mixed with the atmosphere inside the bell jar, which is introduced into the nozzle, and the amount of the silicon deposition raw material gas is increased. In the flow rate amplification nozzles illustrated in the drawings, the opening portion 15 is provided in the nozzle peripheral wall 16, and when the raw material gas flows through the silicon deposition raw material gas flow passage inside the nozzle toward the tip end jetting port, the atmosphere in the periphery of the nozzle is suctioned into the peripheral wall opening portion 15, and the increase in the amount is exhibited. However, the structure of the flow rate amplification nozzle is not limited to the above-described structure. For example, the nozzle may have such structure that a part of the bell jar atmosphere is taken out from an exhaust port inside the bell jar, is pressurized, is supplied through a thin tube inserted into the silicon deposition raw material gas flow passage of the gas supply nozzle, and is mixed with the raw material gas.

A material of the flow rate amplification nozzle is not particularly limited as long as a raw material reaction gas supplied is not contaminated, and examples thereof include silicon, silicon carbide, quartz, graphite, a graphite coated with silicon, and the like.

The flow rate amplification nozzle can be provided as at least one of a plurality of gas supply nozzle in a reactor for manufacturing the polycrystalline silicon rod. That is, in the reactor, a plurality of gas supply nozzles are dispersed over approximately all regions of an upper surface of the bottom plate and are provided with appropriate intervals so as to uniformly supply the raw material gas to each silicon core wire, and the flow rate amplification nozzle may be provided as at least one of the nozzles. From the viewpoint of exhibiting the effect by the flow rate amplification to the maximum, it is particularly preferable that all of the nozzles be the flow rate amplification nozzle.

Manufacturing of the polycrystalline silicon rod by the reactor using the flow rate amplification nozzle is performed by energizing the silicon core wire to heat the silicon core wire to a temperature equal to or higher than approximately 600° C. that is a polycrystalline silicon deposition temperature. Typically, it is preferable to heat the silicon core wire to a temperature of approximately 900° C. to 1200° C. to rapidly deposit the polycrystalline silicon.

As the silicon deposition raw material gas, silane compound such as monosilane, trichlorosilane, silicon tetrachloride, monochlorosilane, dichlorosilane, or the like is used, and typically, trichlorosilane is preferably used. In addition, as the reducing gas, typically, a hydrogen gas is used. For example, when trichlorosilane is used as the silane compound, and deposition of silicon is performed at 1000° C., as a supply amount of a chlorosilane gas per silicon surface area, a range of 0.02 to 0.07 mol/cm$^2$·h is preferable.

Since the flow rate amplification nozzle is used, the silicon deposition raw material gas supplied to the nozzle is mixed with the atmosphere inside the bell jar, and the amount increases. An unreacted raw material gas is included in the atmosphere inside the bell jar, and thus the amount of the raw material gas in the gas jetted from the nozzle increases. As a result, the raw material gas utilization efficiency and an intensity of the raw material is improved. In addition, typically, a temperature of the silicon deposition raw material gas supplied to the nozzle is approximately room temperature. Accordingly, a surface temperature of a silicon rod in the vicinity of the tip end jetting port may be lowered, and thus deposition of silicon may not be sufficient, a rod diameter may be non-uniform, or popcorn may be generated. However, when using the flow rate amplification nozzle, the raw material gas supplied to the nozzle suctions the atmosphere gas inside the bell jar. The atmosphere gas inside the bell jar has a sufficiently high temperature. As a result, the temperature of the raw material gas mixed with the atmosphere gas inside the bell jar also rises, an excessive decrease in the surface temperature of the silicon rod is suppressed, and an intensity of power is also improved.

EXAMPLES

Hereinafter, the invention will be described in detail with reference to examples and comparative examples, but the invention is not limited at all by the examples and the comparative examples.

Example 1 and Comparative Example 1

A reactor having the structure illustrated in FIG. 6 and having the following specifications was prepared.

Bell jar volume: 3 m$^3$

Silicon core wire provided in the bottom plate: 10 pieces (inverted U-shape: 5 pairs)

Gas supply nozzle provided in the bottom plate: 6 pieces (set to have uniform intervals over approximately the entire region of the upper surface of the bottom plate)

All of the gas supply nozzles were set to be the structure illustrated in FIG. 1 in which the inner cross-sectional area at the upper end of the peripheral wall opening portion 15 is 1.3 times the inner cross-sectional area at the lower end of the peripheral wall opening portion. At this time, a pressure difference between the silicon deposition raw material gas flowing through the silicon deposition raw material gas flow passage 12 and the atmosphere gas was 600 Pa.

In manufacturing of the polycrystalline silicon, the silicon core wire was energized to be heated to 1000° C., a mixed gas of trichlorosilane and hydrogen was used as the silicon deposition raw material gas, the mixed gas was supplied at 700 Nm$^3$/h to the maximum, and a silicon deposition reaction was performed for 100 hours by the Siemens method. As a result, ten polycrystalline silicon rods having a diameter of 120 mm were obtained.

As a comparative example, ten polycrystalline silicon rods were obtained in a similar manner as in the manufacturing of the polycrystalline silicon mentioned above except that a typical direct barrel type nozzle in which the peripheral wall opening portion 15 was not provided in the peripheral wall was used as all of the gas supply nozzles instead of the flow rate amplification nozzle, and the maximum supply amount of the silicon deposition raw material gas was changed to 800 Nm$^3$/h because there is no function of increasing the amount of the silicon deposition raw material gas through mixing with the atmosphere inside the bell jar. Note that, in the manufacturing result after passage of 100 hours of silicon deposition time, each of the polycrystalline silicon rods did not grow to a diameter of 120 mm differently from the above-described manufacturing, but manufacturing was terminated at that time.

As a result, in the manufacturing using the flow rate amplification nozzle as the gas supply nozzles, in comparison to the comparative manufacturing using the typical direct barrel type nozzle, the power used per 1 kg of polycrystalline silicon was decreased to 98%, and the amount of trichlorosilane used per 1 kg of polycrystalline silicon was decreased to 97%. In addition, from a result of observation on a surface of each of the obtained polycrystalline silicon rods, in rods manufactured by using the flow rate amplification nozzle as the gas supply nozzles, an area in which popcorn-shaped unevenness occurs on the entire surface was decreased by 73% in comparison to the same area occurred in rods manufactured by using the typical direct barrel type nozzle.

EXPLANATIONS OF LETTERS OR NUMERALS

1 Reactor
2 Bell Jar
3 Bottom Plate
4 Silicon Core Wire
5 Electrode Pair
6 Gas Supply Nozzle
11 Nozzle Main Body
12 Silicon Deposition Raw Material Gas Flow Passage
13 Raw Material Gas Supply Port
14 Tip End Jetting Port
15 Peripheral Wall Opening Portion
16 Nozzle Peripheral Wall 17 Reduced Diameter Portion
18 Overhang Portion
19 Constriction Portion
20 Small Opening

The invention claimed is:

1. A method for manufacturing a polycrystalline silicon rod,
wherein the method uses a reactor having a structure in which the inside is hermetically sealed by a bell jar and a bottom plate, the bottom plate is provided with a plurality of electrode pair that holds silicon core wires and energizes the silicon core wires, and a plurality of gas supply nozzles for supplying a silicon deposition raw material gas to an inner space of the bell jar are provided with such manner that each tip end jetting port faces upward, and
the silicon deposition raw material gas is jetted from the gas supply nozzles while energizing the silicon core wires to deposit polycrystalline silicon on the silicon core wires, characterized in that:
at least one of the gas supply nozzles is a flow rate amplification nozzle having such function that the silicon deposition raw material gas supplied to the nozzle is mixed with an atmosphere inside the bell jar, which is introduced into the nozzle, and the mixed gas in which the amount of the silicon deposition raw material gas is increased is jetted.

2. The method for manufacturing a polycrystalline silicon rod according to claim 1, wherein the flow rate amplification nozzle is provided with an opening portion in a nozzle peripheral wall, and is capable of suctioning an atmosphere at the periphery of the nozzle from the peripheral wall opening portion into a silicon deposition raw material gas flow passage when the raw material gas flows through the silicon deposition raw material gas flow passage inside the nozzle toward the tip end jetting port.

3. The method for manufacturing a polycrystalline silicon rod according to claim 2, wherein the flow rate amplification nozzle has a structure in which an inner cross-sectional area of the silicon deposition raw material gas flow passage at upper end portion of an inner wall side opening of the peripheral wall opening portion is larger than an inner cross-sectional area of the passage in the vicinity of lower end portion of an inner wall side opening of the peripheral wall opening portion.

4. The method for manufacturing a polycrystalline silicon rod according to claim 1, wherein the silicon deposition raw material gas supplied to the nozzle is mixed with the atmosphere inside the bell jar, which is introduced into the nozzle, and the volume is increased by 1.1 to 3.0 times.

5. A reactor for manufacturing a polycrystalline silicon rod,
wherein the reactor has a structure in which the inside is hermetically sealed by a bell jar and a bottom plate, the bottom plate is provided with a plurality of electrode pair that holds silicon core wires and energizes the silicon core wires, and a plurality of gas supply nozzles for supplying a silicon deposition raw material gas to an inner space of the bell jar are provided with such manner that each tip end jetting port faces upward, and
at least one of the gas supply nozzles is a flow rate amplification nozzle having function that the silicon deposition raw material gas supplied to the nozzle is mixed with an atmosphere inside the bell jar, which is introduced into the nozzle, and mixed gas is jetted in a state that the amount of the silicon deposition raw material gas is increased.

6. The reactor for manufacturing a polycrystalline silicon rod according to claim 5, wherein the flow rate amplification nozzle is provided with an opening portion in a nozzle peripheral wall, and is capable of suctioning an atmosphere at the periphery of the nozzle from the peripheral wall opening portion into a silicon deposition raw material gas flow passage when the raw material gas flows through the silicon deposition raw material gas flow passage inside the nozzle toward the tip end jetting port.

7. The reactor for manufacturing a polycrystalline silicon rod according to claim 6, wherein the flow rate amplification nozzle has a structure in which an inner cross-sectional area of the silicon deposition raw material gas flow passage at upper end portion of an inner wall side opening of the peripheral wall opening portion is larger than an inner cross-sectional area of the passage in the vicinity of lower end portion of an inner wall side opening of the peripheral wall opening portion.

8. A method for manufacturing a polycrystalline silicon rod,
providing a reactor comprising an inside that is hermetically sealed by a bell jar and a bottom plate, the bottom plate being provided with 1) a plurality of electrode pairs that holds silicon core wires and energizes the silicon core wires, and 2) a plurality of gas supply nozzles for supplying a silicon deposition raw material gas to an inner space of the bell jar wherein each tip end jetting port faces upward;
jetting the silicon deposition raw material gas from the plurality of gas supply nozzles while energizing the silicon core wires to deposit polycrystalline silicon on the silicon core wires;
supplying the silicon deposition raw material gas to a flow rate amplification nozzle, thereby mixing the supplied silicon deposition raw material gas with an atmosphere inside the bell jar, which is introduced into the nozzle;
jetting the mixed gas in which the amount of the silicon deposition raw material gas is increased.

* * * * *